US011451092B2

(12) United States Patent
Shi et al.

(10) Patent No.: US 11,451,092 B2
(45) Date of Patent: Sep. 20, 2022

(54) WIRELESS CHARGING METHOD FOR ASSEMBLY LINE

(71) Applicant: Robert Bosch GmbH, Stuttgart (DE)

(72) Inventors: Xingyi Shi, Sunnyvale, CA (US); Huang Lee, Mountain View, CA (US); Vivek Jain, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 297 days.

(21) Appl. No.: 16/629,946

(22) PCT Filed: Aug. 29, 2018

(86) PCT No.: PCT/US2018/048492
§ 371 (c)(1),
(2) Date: Jan. 9, 2020

(87) PCT Pub. No.: WO2019/046393
PCT Pub. Date: Mar. 7, 2019

(65) Prior Publication Data
US 2020/0153284 A1 May 14, 2020

Related U.S. Application Data

(60) Provisional application No. 62/552,732, filed on Aug. 31, 2017.

(51) Int. Cl.
*H02J 50/00* (2016.01)
*B29D 29/06* (2006.01)
(Continued)

(52) U.S. Cl.
CPC ............ *H02J 50/12* (2016.02); *B65G 15/02* (2013.01); *H02J 7/0013* (2013.01); *H02J 7/02* (2013.01);
(Continued)

(58) Field of Classification Search
CPC .. H02J 50/12; H02J 7/0013; H02J 7/02; H02J 50/40; H02J 7/345; H02J 50/005;
(Continued)

(56) References Cited

U.S. PATENT DOCUMENTS

2012/0242160 A1* 9/2012 Tseng .................. H04B 5/0037
307/104
2016/0101860 A1 4/2016 Himmelmann
(Continued)

FOREIGN PATENT DOCUMENTS

EP 2330262 A2 * 6/2011 .......... B60L 11/1816
EP 3 175 531 B1 4/2019
(Continued)

OTHER PUBLICATIONS

European Supplementary Search Report corresponding to European Patent Application No. 18 85 1103, dated Jan. 29, 2021 (2 pages).
International Search Report corresponding to PCT Application No. PCT/US2018/048492, dated Dec. 28, 2018 (3 pages).

*Primary Examiner* — Nghia M Doan
(74) *Attorney, Agent, or Firm* — Maginot, Moore & Beck LLP

(57) ABSTRACT

An assembly line includes a conveyor belt and an energy charging system. The energy charging system includes (i) a resonator having a TX resonator disposed along the conveyor belt and a RX resonator mounted on and transported by the conveyor belt, (ii) an impedance matching network in communication with the resonator, (iii) and an energy storage device in communication with at least one of the resonator and the impedance matching network. $V_{min}$ is a minimum voltage of the energy storage device, and $V_{cap}$ is a voltage across the energy storage device measured in real time. Energy is transferred from the TX resonator to the RX resonator when the $V_{cap}$ is less than $V_{min}$ of the energy storage device.

15 Claims, 8 Drawing Sheets

(51) Int. Cl.
    *H02J 50/12*     (2016.01)
    *H02J 50/40*     (2016.01)
    *B65G 15/02*     (2006.01)
    *H02J 7/00*     (2006.01)
    *H02J 7/02*     (2016.01)
    *H03H 11/28*     (2006.01)
    *H02J 7/34*     (2006.01)

(52) U.S. Cl.
    CPC .............. *H02J 50/40* (2016.02); *H03H 11/28* (2013.01); *B65G 2201/0267* (2013.01); *B65G 2203/043* (2013.01); *H02J 7/345* (2013.01)

(58) Field of Classification Search
    CPC ............ B65G 15/02; B65G 2201/0267; B65G 2203/043; H03H 11/28; B29D 29/06
    See application file for complete search history.

(56) References Cited

U.S. PATENT DOCUMENTS

| | | |
|---|---|---|
| 2016/0181856 A1 | 6/2016 | Lee et al. |
| 2017/0030648 A1* | 2/2017 | Haines ..................... F27D 3/06 |
| 2017/0030952 A1 | 2/2017 | Shamir et al. |

FOREIGN PATENT DOCUMENTS

| | | | | |
|---|---|---|---|---|
| JP | 2006-052039 A | 2/2006 | | |
| JP | 2009-246036 A | 10/2009 | | |
| WO | 2012/071198 A2 | 5/2012 | | |
| WO | WO-2012071198 A2 * | 5/2012 | ........... | G01D 11/245 |
| WO | 2016/019159 A1 | 2/2016 | | |

* cited by examiner

WIRELESS CHARGING METHOD FOR ASSEMBLY LINE

CROSS-REFERENCE TO RELATED APPLICATIONS

This application is a 35 U.S.C. § 371 National Stage Application of PCT/US2018/048492, filed on Aug. 29, 2018, which claims priority to U.S. Provisional Application Ser. No. 62/552,732, filed on Aug. 31, 2017, the disclosures of which are incorporated herein by reference in their entirety.

TECHNICAL FIELD

The disclosure relates generally to wireless charging systems, and, in particular, to wireless charging systems for assembly lines.

BACKGROUND

Assembly lines typically have a conveyor system which is configured to transport pallets along a fixed path by one or more work stations. The pallets support objects, such as parts, components, devices, and the like. The work stations include automated machines, e.g., robots, which are configured to perform tasks on the objects supported on the pallets as the pallets are moved along the conveyor path.

Sensors and other electronic devices are often incorporated onto the pallets for various reasons. For example, sensors may be used to detect environmental parameters pertaining to the objects on the pallets, such as temperature, pressure, humidity, etc. Position sensors may be used to indicate the position of the objects and/or the pallets. Electronic devices, such as communication equipment, may also be incorporated onto the pallet to enable wireless data transfer.

The sensors and electronic devices incorporated into the pallets may be powered by batteries. However, the batteries must be periodically replaced and/or recharged which can be time consuming, especially when considering that hundreds to thousands of sensors and electronic devices may be used on an assembly line. What is needed is an automated method of maintaining power and/or charge to the sensors and other electronic devices utilized on the pallets of an assembly line.

DETAILED DESCRIPTION

Figure 1A:
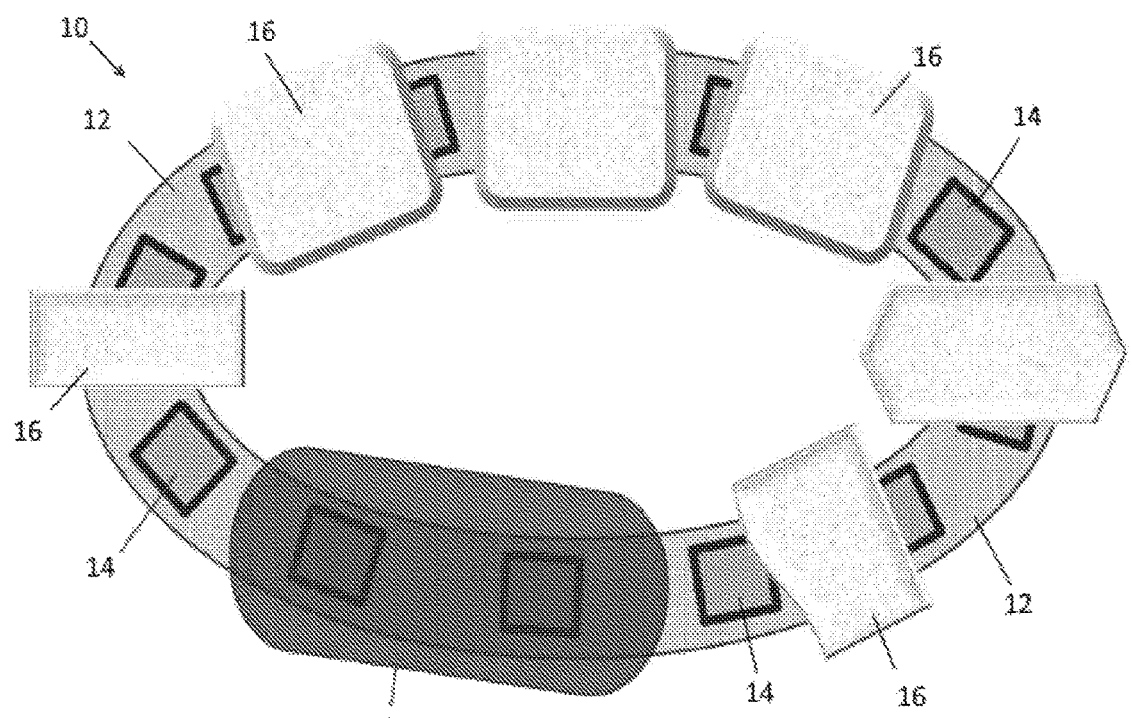
FIG. 1A is a schematic illustration of an assembly line and wireless charging system arrangement according to one embodiment of the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The present disclosure is directed to an automatic wireless charging system for an assembly line that enables sensors and other electronic devices being transported on the pallets along the assembly line to be powered and/or charged without the having to manually replace batteries and/or recharge rechargeable batteries. The system is also directed to controlling the voltages of the charging system to minimize the charge on energy storage components in order to increase the life time of the components.

Referring to FIG. 1A, an assembly line and wireless charging system 10 according to one embodiment of the present disclosure is depicted. The assembly line includes a conveyor system 12 having one or more conveyor belts, or the like, which are arranged to form a continuous, fixed path. The conveyor system 12 is configured to transport a plurality of pallets 14 along the path. Work stations 16 are arranged along the conveyor path. The pallets 14 are configured to support one or more objects (not shown), such as parts, devices, components, and the like, in order to transport the objects by each of the work stations. The work stations 16 include machines and factory equipment which are configured to perform one or more tasks in relation to the objects on the pallets 14 as the pallets 14 pass by the work station 16.

Sensors and other electronic devices (See, e.g., FIG. 2, 20) may be incorporated onto the pallets for various reasons. For example, sensors 20 may be used to detect environmental parameters pertaining to the objects on the pallets, such as temperature, pressure, humidity, etc. Position sensors may be used to indicate the position of the objects and/or the pallets. Electronic devices, such as communication equipment, may also be incorporated onto the pallet to enable wireless data transfer.

The wireless charging system is configured to wirelessly power and/or charge any sensors and electronic devices located on the pallets. The wireless charging system is configured to use near-field magnetic resonance to wirelessly transfer power and/or to charge the electronic devices on the pallets. Near-field magnetic resonance is used because it has high efficiency, low EM radiation, and moderate flexible. A simplified block diagram of a near-field magnetic resonance charging system is depicted in FIG. 2.

Figure 2:
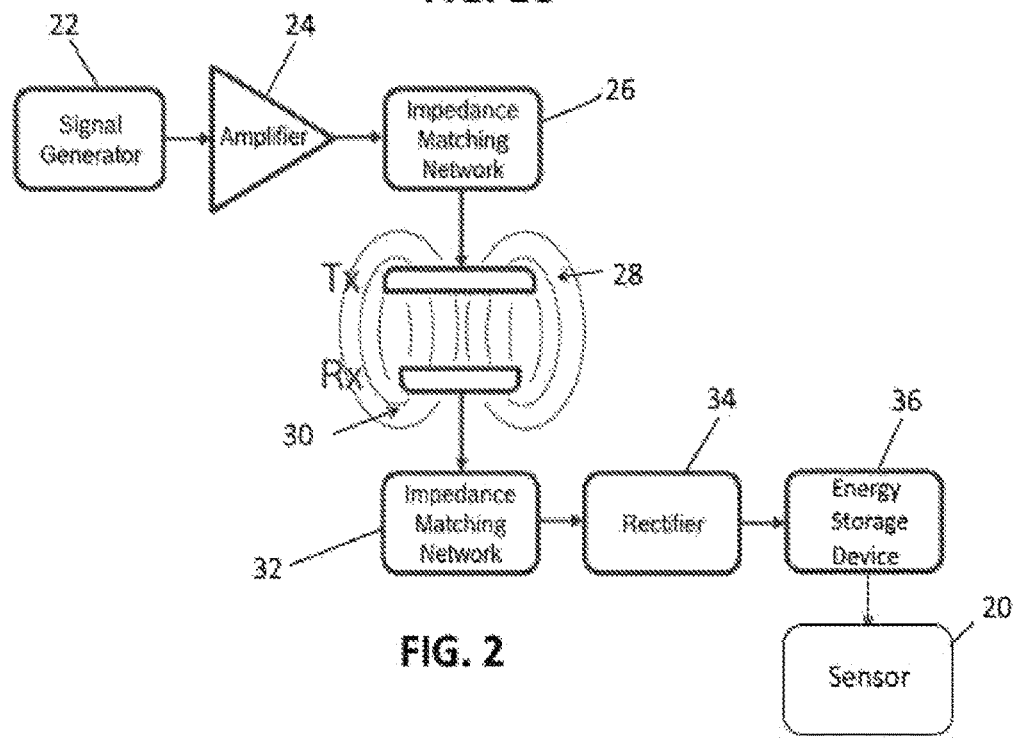
FIG. 2 is a block diagram of the wireless charging system of FIGS. 1 and 2.

The charging system of FIG. 2 includes a resonator structure comprising a transmitter (TX) resonator 28, also referred to herein as a TX coil, and a receiver (RX) resonator 30, also referred to herein as a RX coil. The TX coil 28 is the primary coil in the magnetic resonance charging scheme and is used to generate an alternating electromagnetic field. To generate the electromagnetic field, a signal generator 22 outputs an alternating signal which is amplified by an amplifier 24 before being fed to the TX coil 28.

The RX coil 30 is the secondary coil in the magnetic resonance charging scheme. The alternating electromagnetic field generated by the TX coil 28 induces an alternating current in the RX coil 30. This current is used to power and/or charge the electronics 20, e.g., sensors and devices, incorporated into the pallets. A rectifier 34 may be used to rectify the received current before it is supplied to an energy storage device 36. The energy storage device 36 provides power/charge to the sensor 20.

Figure 3:
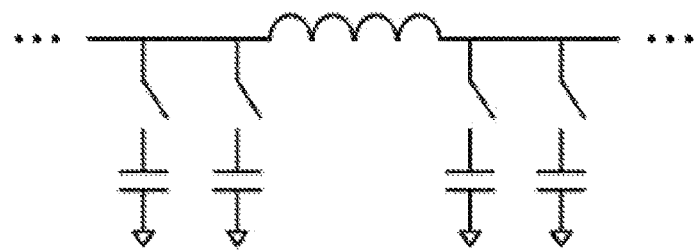
FIG. 3 is a diagram of one type of impedance matching circuit for use with the wireless charging system of FIG. 2.

Impedance matching is a key factor in efficiency for magnetic resonant near-field wireless power transfer. To this end, transmit and/or receive sides of the resonance charging system may include impedance matching networks 26, 32. As is known in the art, impedance matching networks may be used to match the impedances of the transmit and receive coils to improve the efficiency of power transfer. In one embodiment, a π-match network is used for impedance matching. An example of a π-matching network is depicted in FIG. 3.

Referring again to FIG. 2, the current induced in the RX coil 30 is supplied to at least one energy storage device 36. The energy storage device 36 in turn is configured to supply energy to one or more electronic device(s) 20 associated therewith. The energy from the energy storage device 36 may be used to power or charge the associated electronics. Any suitable type of energy storage device 36 may be used, such as capacitors, supercapacitors, ultracapacitors, batteries and the like. In the embodiments described below, the energy storage device 36 is described as a supercapacitor which are known for having a long life and high charging current capability. It is to be understood that other types of energy storage devices may be used as an alternative to or in addition to supercapacitors.

Figure 1B:
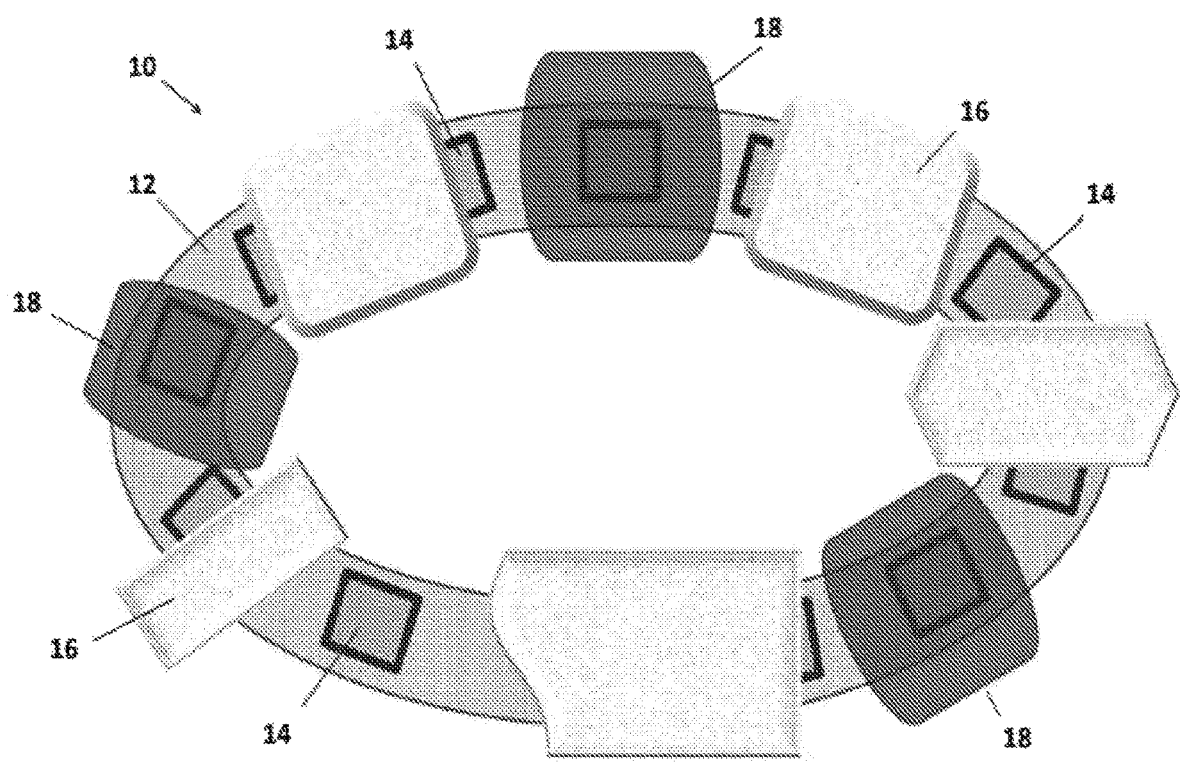
FIG. 1B is a schematic illustration of an assembly line and wireless charging system arrangement according to another embodiment of the present disclosure.
Figure 1C:
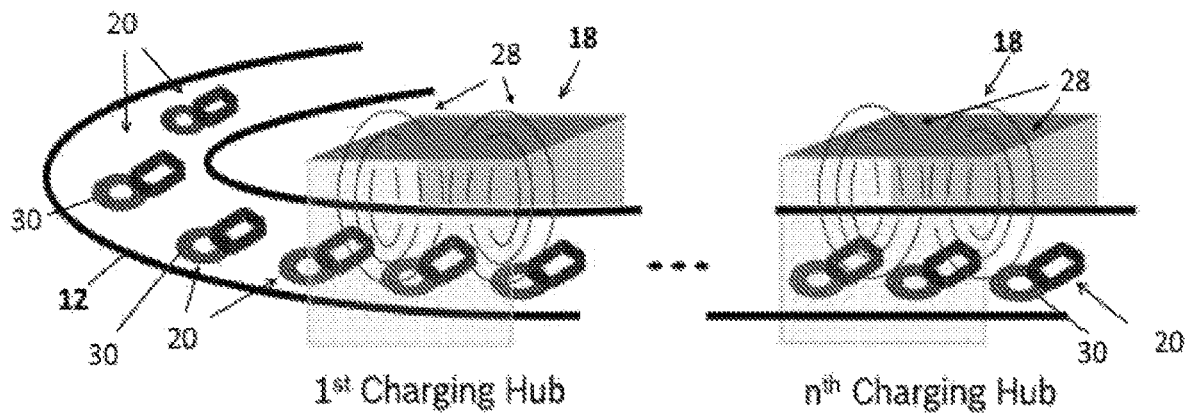
FIG. 1C is a schematic illustration of a side view of a portion of the assembly line showing a charging station of the wireless charging system of FIG. 1 or FIG. 2.

To implement the resonance charging system, the TX coil 28 is provided at a charging station 18 which is located at a fixed position along the conveyor path, and at least one RX coil 30 is incorporated onto each pallet 14. Although a single charging station with a single TX coil may be used to charge the electronics on the pallets, a plurality of charging stations each having at least one TX coil 30 may be used as depicted in FIGS. 1A-1C. FIG. 1A shows an embodiment in which a plurality of charging stations 18 are arranged in succession at a single location along the conveyor path. FIG. 1B shows another embodiment in which a plurality of charging stations 18 are provided at different locations along the conveyor path.

As can be seen in FIG. 1C, the TX coils 28 and the RX coils 30 are arranged so that the RX coils 30 pass through the electromagnetic fields generated by the TX coils 28 in the charging stations. Any suitable number and positioning of charging stations and/or TX coils may be used. The charging stations may be fixed on the assembly line with both horizontal and vertical movement freedom to optimize power transfer. The horizontal and vertical adjustments may be made manually by a user of the system or may be made automatically with the appropriate equipment as is known in the art.

Figure 4A:
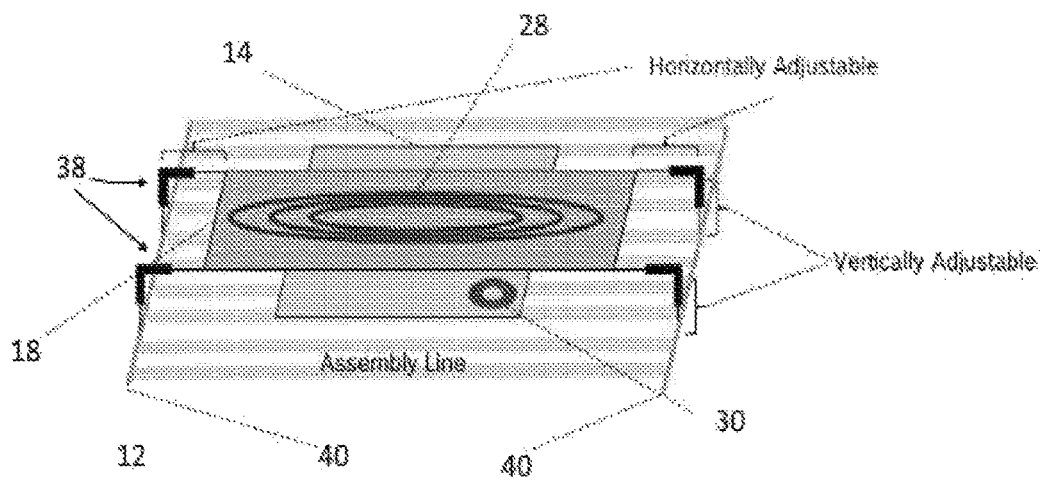
FIG. 4A is a schematic illustration of a charging station of the wireless charging system of FIG. 1 or 2 shown fixed to the assembly line.
Figure 4B:
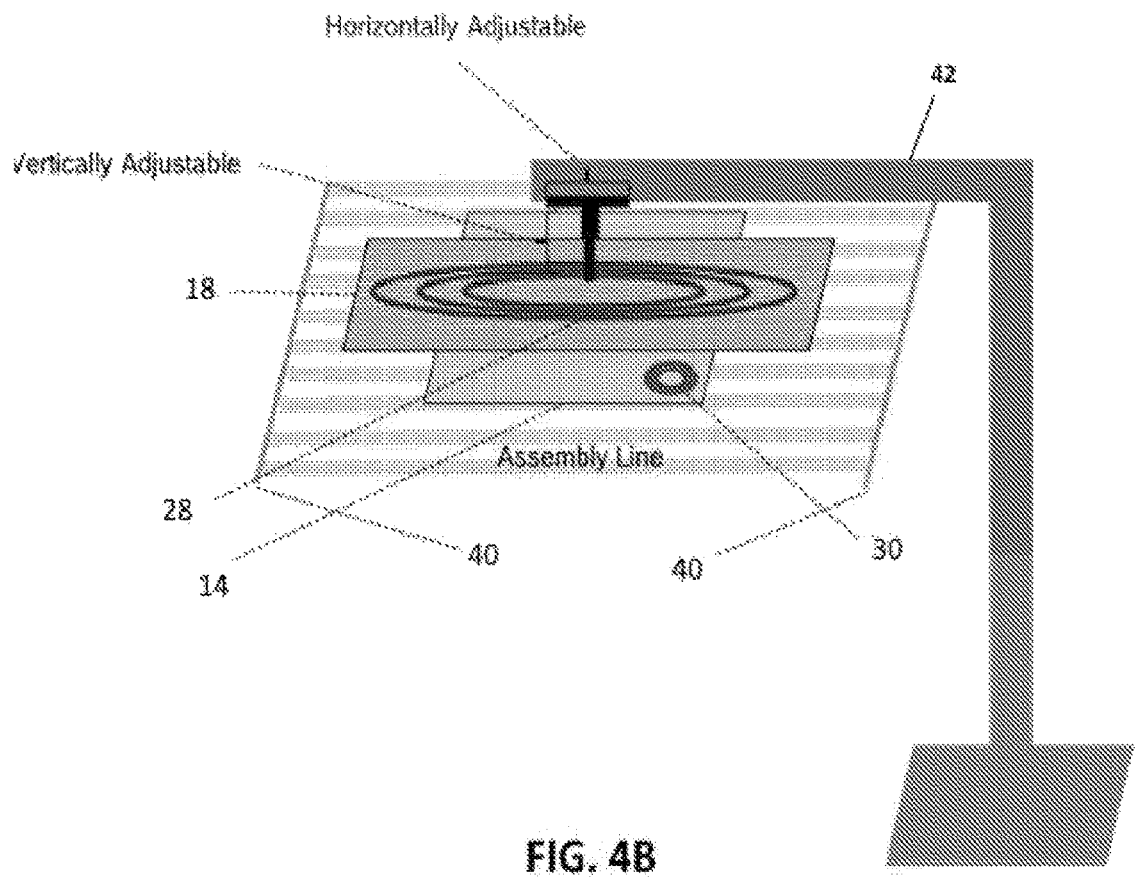
FIG. 4B is a schematic illustration of a charging station of the wireless charging system of FIG. 1 or 2 shown supported by a stand.
Figure 5:
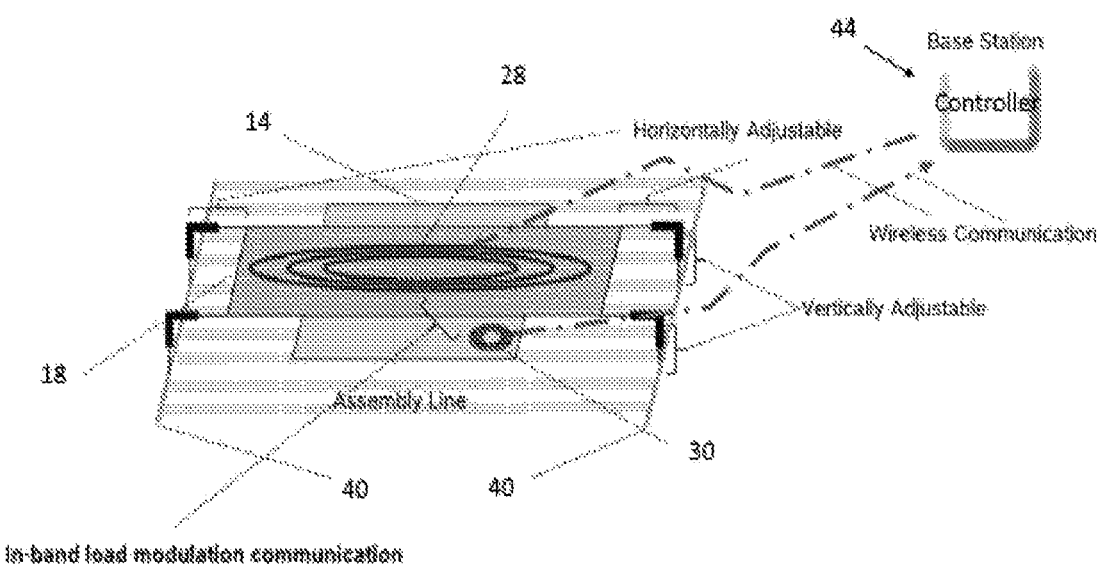
FIG. 5 is a schematic illustration of a charging station showing feedback to the transmitter.

The charging stations 18 with the TX coils 28 can be provided on a support structure 38 attached to the assembly line rails 40 as depicted in FIG. 4A or to a stand 42 that is separate from the assembly line as shown in FIG. 4B. Horizontal and vertical adjustment mechanisms may be incorporated into the support structure or stand. The TX coil 28 can get an implicit feedback using in-band load modulation communication (similar to NFC). Further, the TX side be equipped with wireless radio to receive feedback about charging efficiency directly from the receivers or via the control system 44 as shown in FIG. 5.

A charging algorithm for the wireless charging system will now be described. The charging algorithm is directed to controlling the voltage across the supercapacitor and the charging current that contributes to the self-heat temperature. Because the life of the supercapacitor may be maximized when less charge is stored, the charging algorithm is configured to minimize the charge on the supercapacitor. Based on the amount of energy on the supercapacitor and the time until the next charging event, the algorithm enables a decision to made as to whether or not to charge the supercapacitor, the amount of energy used to charge the supercapacitor, the time duration to charge, the charging current, with an eye toward prolonging life cycles and minimizing system cost. The values used in the algorithm are computed based on given factory parameters and requirements in the design phase. Then in the operation phase, the algorithm enables real-time charging decisions using the computed values from the design phase.

Input parameters for the charging algorithm include (i) factory parameters, such as speed of the conveyor belt ($V_{belt}$), time duration between each charging event ($t_{period}$), length of the conveyor belt (L), and minimum separation between objects to be charged ($d_{space}$), (ii) sensor parameters, such as operating voltage ($V_{op}$) and operator power ($P_{load}$), (iii) energy storage parameters, such as capacitance (C), leakage resistance ($R_{leak}$), maximum current ($I_{charge\_max}$), and capacitor voltage ($V_{cap}$), and (iv) transmitter coil parameters, such as diameter of the TX coil ($D_{TX}$). In addition, the charging algorithm may be configured to utilize a reduced power mode, which gives the option for lowering charging power by increasing the number of transmitters if desired by the end user. A scalar value ($\alpha_{power}$) indicating the amount of power reduction in the reduced power mode is also an input parameter for the charging algorithm.

The output parameters of the charging algorithm include $V_{min}$, $I_{charge}$, and $t_{charge}$, as well as #TX. $V_{min}$, $I_{charge}$, and $t_{charge}$ are parameters used to control the operation of the energy storage device. #TX is the number of TX resonators needed to generate the required power. $V_{min}$ is the minimum voltage of the capacitor that can provide enough energy to the electronic device before the next charging event happen. $V_{min}$ is calculated based on the following equation:

$$\tfrac{1}{2}C(V_{min}^2 - V_{op}^2) = P_{load} \cdot t_{period} + E_{leak}$$

solving for $V_{min}$, where $$E_{leak} = \int_0^{t_{period}} \frac{v^2(\tau)}{R_{leak}} d\tau$$

results in the following equation:

$$V_{min} = \sqrt{P_{load} \cdot R_{leak} \cdot e^{\frac{2t_{period}}{R_{leak} \cdot C}} - P_{load} \cdot R_{leak} + V_{op}^2 \cdot e^{\frac{2t_{period}}{R_{leak} \cdot C}}}$$

$I_{charge}$ is the current to charge the energy storage device. To reduce the wireless transmit power, the reduced power transfer mode may be enabled, which reduces $I_{charge}$ while the other parameters (eg. $t_{charge}$) are changed accordingly to achieve the $V_{min}$ requirement. If the reduced power transfer mode is disabled, $I_{charge}=I_{charge\_max}$. When the reduced power transfer mode is enabled, $I_{charge}=I_{charge\_max}/\alpha_{power}$. If the spacing between objects ($d_{space}$) is less than the diameter of the TX coil (DTX), then more than one receiver coil may pass under the transmitter coil at the same time. As a result, transmitter power ($I_{charge}$) must be increased accordingly.

The parameter $t_{charge}$ is the time needed to charge the energy storage device to an expected voltage which may calculated based on the following equation:

$$t_{charge} = \frac{C \cdot (V_{min} - V_{cap})}{I_{charge}}$$

The following equation may be used to calculate #TX.

$$\#TX = \frac{V_{belt} \cdot I_{charge}}{D_{TX}}$$

Figure 6:
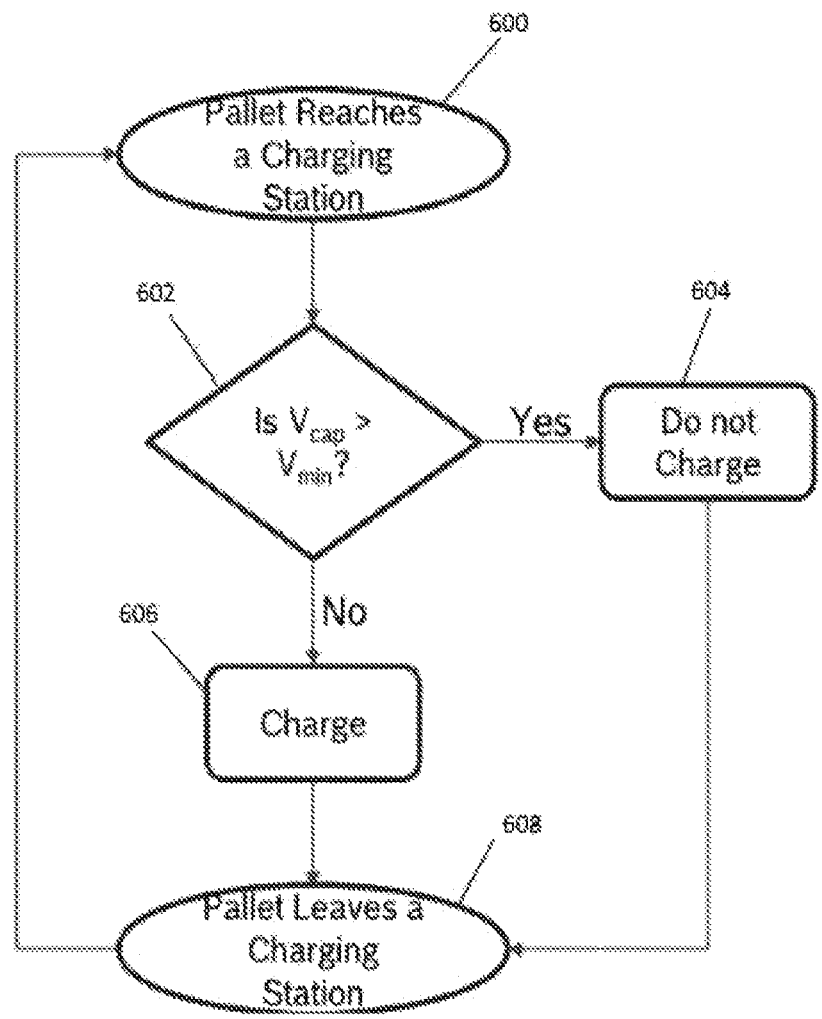
FIG. 6 is a flowchart of a charging algorithm for the wireless charging system of FIGS. 1-2.

A flowchart depicting the logic of the charging algorithm is depicted in FIG. 6. During operation, $V_{cap}$ is measured in real time. $V_{min}$ is calculated during the design phase according to the equations described above. According to the flowchart, once a pallet reaches a charging station (step 600), a determination is made as to whether the voltage across the energy storage device ($V_{cap}$), e.g., supercapacitor, is greater than $V_{min}$ (step 602). If $V_{cap}$ is greater than $V_{min}$, no charging takes place (step 604). If $V_{cap}$ is not greater than $V_{min}$, the TX coil is activated resulting in charging of the energy storage device (step 606). The position of a pallet and/or RX coil on a pallet may be determined in any suitable manner.

When it is time to charge, the charge current is based on the computation result in the design section. Because there is efficiency loss during wireless power transfer, the power output of the TX coil can be increased to compensate for the loss so it can deliver the expected current. The efficiency is based on the transmitter design and the distance limit between the transmitter and receiver. The transmitter will not charge the unless the energy storage device cannot provide enough energy to the load before the next charging event. The charging operation is controlled in accordance with the charging current ($I_{charge}$) and the charging time ($t_{charge}$) computed in the design phase.

When the target to be charged is moving, the relative impedance changes based on the target position with respect to the TX coil. When impedance is not matched, the wireless power transfer efficiency suffers. Dynamic impedance tuning, used in other work, is not time efficient. An impedance tuning method is proposed herein for improving the power transfer efficiency particularly for moving objects.

Figure 7A:
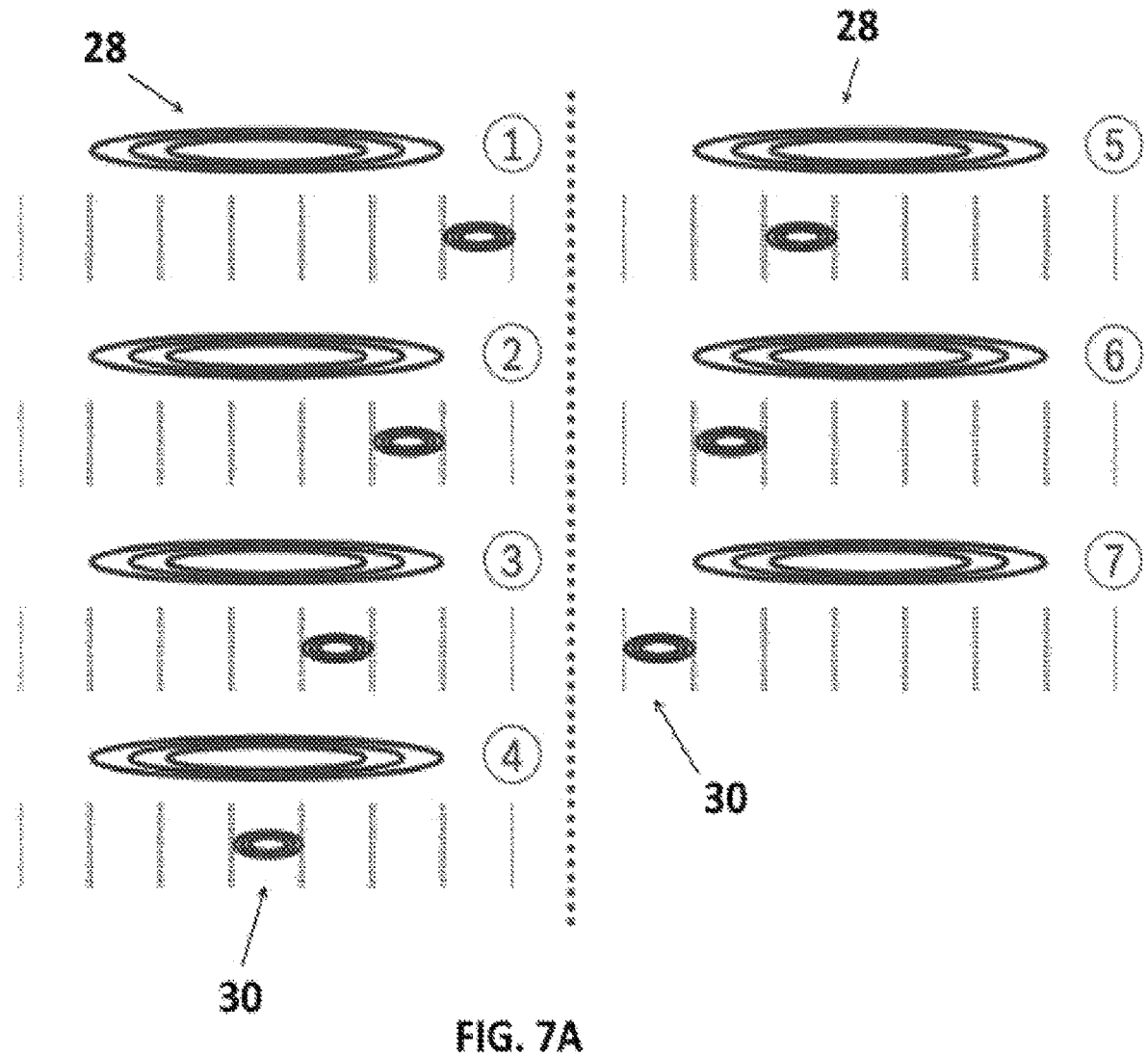
FIG. 7A is a schematic illustration showing the charging region of a transmitter coil divided into a plurality of zones with a single receiver coil in the charging region.
Figure 7B:
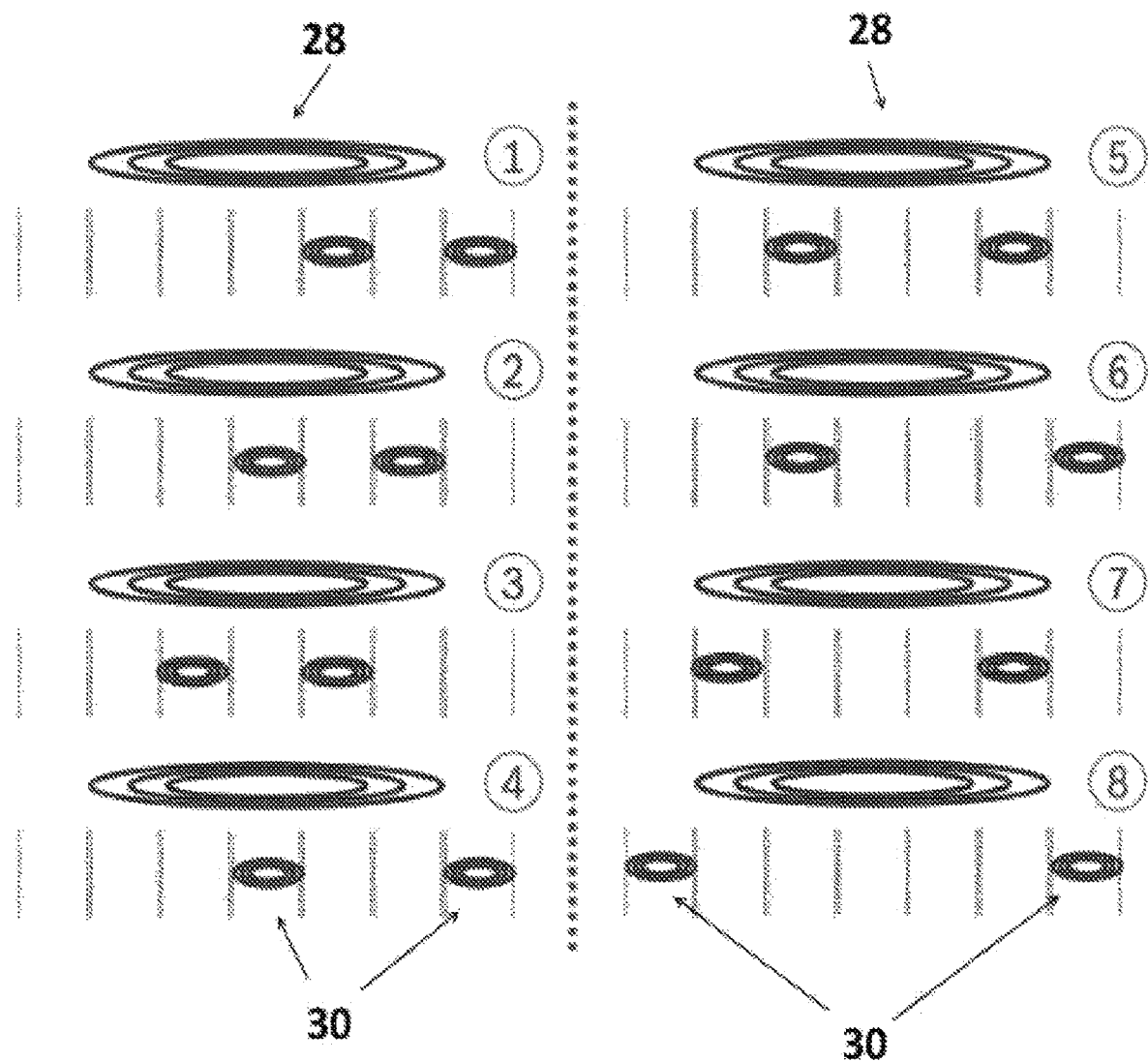
FIG. 7B is a schematic illustration showing the charging region of a transmitter coil divided into a plurality of zones with two receiver coils in the charging region.

To optimize the impedance tuning, the area under and near the transmitter coil 28, referred to herein as a charging region, is divided into several zones and optimal impedance matching values are computed separately for each zone. FIGS. 7A and 7B illustrate examples of how the charging region under a TX coil may be divided. The charging region is divided into seven zones (n=7) in FIGS. 7A and 7B. FIG. 7A depicts an example in which one RX coil 30 is passing through the charging region, and FIG. 7B depicts an example in which two RX coils 30 passing through the charging region.

The design phase of the resonance charging system results in a set of impedance values which are used to set the impedance of one or both of the TX coil 28 and RX coil 30 based on the position of the RX coil under the TX coil. The parameters used to calculate the impedance values include (i) the distance between transmitter and receiver (minimum clearance of equipment installation hanging on top of the conveyor belt specified by the factory, $d_{clear}$), (ii) the sizes of transmitter and receiver coils (how to choose the sizes are not in the scope of this work), and (iii) the minimum separation distance between objects to be charged ($d_{space}$).

Figure 8:
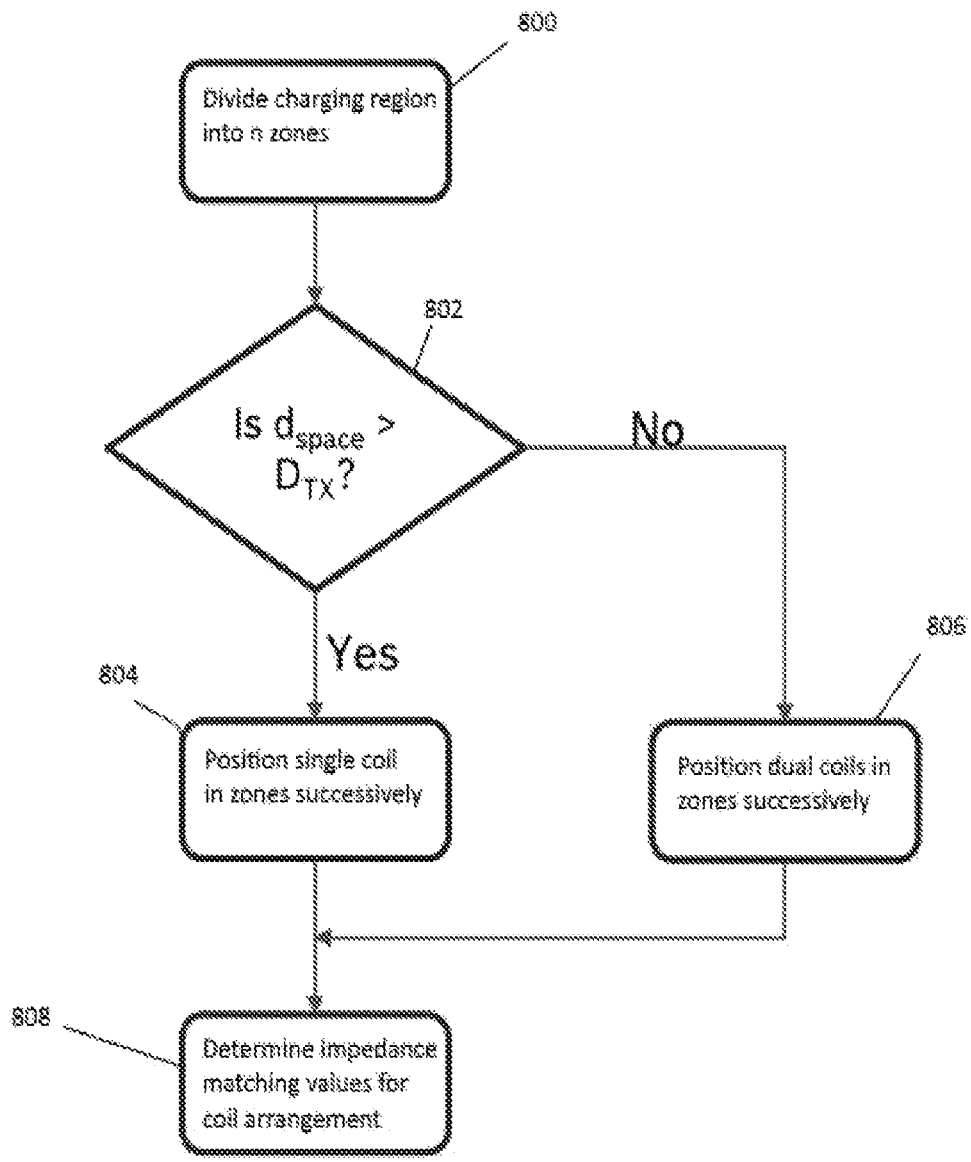
FIG. 8 is a flowchart of a method of determining impedance matching values for each zone and coil arrangement of FIGS. 7A and 7B.

A flowchart of a method of generating impedance matching values for power transfer based on relative positioning of the TX coil and RX coil is depicted in FIG. 8. First, the charging region is divided into a number of zones, n (step 800). The size of each zone may correspond to the size of the RX coil although not necessarily. Each zone may share some overlapping area with a neighboring zone. Depending on the size of the minimum spacing between RX coils ($d_{space}$) relative to the diameter of the TX coil ($D_{TX}$), single coil arrangements or dual coil arrangements are utilized (step 802).

Impedance matching values are determined for situations in which a single RX coil is located in the charging region (step 804). To determine the impedance matching values under single RX coil conditions, a receiver coil is positioned in parallel to the transmitter coil in a first one of the zones at the fixed vertical separation distance ($d_{clear}$) that will be implemented during operations, and impedance matching values are determined for that zone for the single coil condition. The process is repeated for each zone so that impedance matching values are determined for each zone under single RX coil conditions (step 808).

Impedance matching values are also determined for other RX coil conditions, such as two RX coils being in the charging region (step 806). A similar process is used to determine the impedance matching values for multiple receiver coils. In the case of two receiver coils, the two receiver coils are positioned at the fixed vertical separation distance $d_{clear}$ with the two receiver coils being arranged parallel to the transmitter coil and in separate zones which are spaced apart by at least the minimum distance dspace. Impedance matching values are determined for that arrangement of receiver coils. The receiver coils are moved to a different arrangement and impedance matching values are determined for that arrangement and so on (step 808). The impedance matching values may be stored in a memory which is accessible by a controller for the system for use during operations.

The distance between the centers of each zone is predetermined. However, extremely high resolutions are not necessary as the impedance change is subtle with subtle location change. In the example of FIGS. 7A and 7B where the number of zones n=7, the size of each zone is the size of a receiver coil, and the resolution of the zone is one zone spacing.

For each transmitter and receiver location described above, impedance matching values may be determined for (i) only the impedance matching network on the TX side, (ii) only the impedance matching network on the RX side, and (iii) the impedance matching networks on both the TX side and the RX side in conjunction. The impedance matching values for each location and condition may be determined in any suitable manner.

During operation, the location and number of RX coil(s) in the charging zone is detected in real time using, for example, sensors, cameras, and the like. Impedance matching values are selected for at least one of the TX side, the RX side, and both the TX side and RX side, based on the location(s) of the RX coil(s) (e.g., which zone(s)) and number of RX coils in the charging region. The appropriate impedance matching network(s) are then adjusted, e.g., switched, so that the selected impedance values are generated. The impedance matching values may be updated as needed as the RX coils move from zone to zone through the charging region so that optimum power transfer efficiency may be achieved regardless of the position of the RX coils under the TX coil. Any suitable type of controller and/or processor may be used to select the impedance matching values and to control the impedance matching networks.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. An assembly line comprising:
a conveyor belt;
a workpiece pallet that is transported by the conveyor belt; and
an energy charging system comprising:
    a resonator comprising a TX resonator disposed along the conveyor belt and a RX resonator that is integrated with or mounted on the workpiece pallet;
    an impedance matching network in communication with the resonator and configured to change an impedance of at least one of the TX resonator and the RX resonator to optimize an energy transfer efficiency; and
    an energy storage device that is integrated with or mounted on with the workpiece pallet and configured to receive energy from the RX resonator,
    wherein the energy charging system is configured to transfer energy from the TX resonator to the RX resonator in response to the energy storage device having a real-time voltage that is less than a predefined minimum voltage for the energy storage device.

2. The assembly line of claim 1 further comprising:
a charging station disposed at a position along the conveyor belt, the TX resonator being integrated into the charging station.

3. The assembly line of claim 1, wherein:
the RX resonator comprises a plurality of RX resonators;
the energy storage device comprises a plurality of energy storage devices; and
the workpiece pallet comprises a plurality of workpiece pallets, each workpiece pallet having integrated therewith or mounted thereon a respective one of the plurality of RX resonators and a respective one of the plurality of energy storage devices.

4. The assembly line of claim 3 wherein the impedance matching network is effective to transfer energy between the TX resonator and the RX resonator at distance between the TX resonator and the RX resonator is a first predetermined distance, and, when a distance between first and subsequent resonators is greater than a diameter of the TX resonator.

5. The assembly line of claim 4 wherein the distance between the first and the subsequent RX resonators is set to equal to the diameter of the TX resonator if the distance between the first and the subsequent resonator is greater than the diameter of the TX resonator.

6. The assembly line of claim 1, wherein the energy storage device is one of a capacitor, a super-capacitor, a battery, and an ultra-capacitor.

7. The assembly line of claim 1, wherein the impedance matching network includes a switching system.

8. A method comprising:
providing a conveyor belt;
providing a workpiece pallet that is transported by the conveyor belt; and
providing an energy charging system including (i) a resonator having a TX resonator disposed along the conveyor belt and a RX resonator that is integrated with or mounted on the workpiece pallet, (ii) an impedance matching network that is in communication with the resonator, and (iii) an energy storage device that is integrated with or mounted on the workpiece pallet and configured to receive energy from the RX resonator and configured to change an impedance of at least one of the TX resonator and the RX resonator to optimize an energy transfer efficiency; and
operating the energy charging system to transfer energy from the TX resonator to the RX resonator in response to the energy storage device having a real-time voltage that is less than a predefined minimum voltage for the energy storage device.

9. The method of claim 8 the TX resonator is integrated into a charging station disposed at a position along the conveyor belt.

10. The method of claim 8, wherein:
the RX resonator comprises a plurality of RX resonators;
the energy storage device comprises a plurality of energy storage devices; and
the workpiece pallet comprises providing a plurality of workpiece pallets each workpiece pallet having integrated therewith or mounted thereon a respective one of the plurality of RX resonators and a respective one of the plurality of energy storage devices.

11. The method of claim 10, wherein the impedance matching network is effective to transfer energy between the TX resonator and the RX resonator at distance between the TX resonator and the RX resonator is a first predetermined distance when a distance between first and subsequent RX resonators is greater than a diameter of the TX resonator.

12. The method of claim 11 wherein the distance between the first and the subsequent RX resonator is set to equal to the diameter of the TX resonator if the distance between the first and the subsequent RX resonator is greater than the diameter of the TX resonator.

13. The method of claim 8, wherein the energy storage device is one of a capacitor, a super-capacitor, and an ultra-capacitor.

14. The method of claim 8, wherein the impedance matching network includes a switching system.

15. The method of claim 14, wherein the switching system is a switch capacitor $\pi$-match network.

* * * * *

UNITED STATES PATENT AND TRADEMARK OFFICE
CERTIFICATE OF CORRECTION

PATENT NO. : 11,451,092 B2
APPLICATION NO. : 16/629946
DATED : September 20, 2022
INVENTOR(S) : Shi et al.

It is certified that error appears in the above-identified patent and that said Letters Patent is hereby corrected as shown below:

In the Claims

In Claim 8, at Column 8, Lines 23-24: "the resonator, and (iii)" should read --the resonator and configured to change an impedance of at least one of the TX resonator and the RX resonator to optimize an energy transfer efficiency, and (iii)--.

In Claim 8, at Column 8, Lines 26-29: "from the RX resonator and configured to change an impedance of at least one of the TX resonator and the RX resonator to optimize an energy transfer efficiency; and" should read --from the RX resonator; and--.

In Claim 10, at Column 8, Line 42: "comprises providing a plurality" should read --comprises a plurality--.

Signed and Sealed this
Twenty-eighth Day of March, 2023

Katherine Kelly Vidal
*Director of the United States Patent and Trademark Office*